(12) United States Patent
Niwa

(10) Patent No.: US 8,159,234 B2
(45) Date of Patent: Apr. 17, 2012

(54) PROXIMITY SENSOR

(75) Inventor: Masahisa Niwa, Suita (JP)

(73) Assignee: Panasonic Corporation, Osaka (JP)

( * ) Notice: Subject to any disclaimer, the term of this patent is extended or adjusted under 35 U.S.C. 154(b) by 392 days.

(21) Appl. No.: 12/538,647

(22) Filed: Aug. 10, 2009

(65) Prior Publication Data

US 2010/0033197 A1 Feb. 11, 2010

(30) Foreign Application Priority Data

Aug. 11, 2008 (JP) ................... 2008-207265

(51) Int. Cl.
*G01R 27/26* (2006.01)
*G01B 7/14* (2006.01)
(52) U.S. Cl. ............... 324/686; 324/658; 324/207.16
(58) Field of Classification Search ............ 324/686, 324/658, 649, 600, 663, 207.16, 207.15, 324/207.13, 207.11, 200; 340/545.4; 702/57
See application file for complete search history.

(56) References Cited

U.S. PATENT DOCUMENTS

| | | | |
|---|---|---|---|
| 4,893,076 A | 1/1990 | Leonard et al. | |
| 5,712,621 A * | 1/1998 | Andersen | 340/547 |
| 7,173,410 B1 * | 2/2007 | Pond | 324/207.12 |
| 7,173,411 B1 * | 2/2007 | Pond | 324/207.12 |
| 2005/0162158 A1 * | 7/2005 | Del Monte | 324/207.26 |
| 2009/0051355 A1 | 2/2009 | Yamakawa | |
| 2010/0225332 A1 * | 9/2010 | Niwa et al. | 324/652 |

FOREIGN PATENT DOCUMENTS

| | | |
|---|---|---|
| DE | 38 13 734 A1 | 11/1988 |
| DE | 100 46 147 C1 | 2/2002 |
| EP | 1 931 031 A1 | 6/2008 |
| JP | 2000-132226 A | 5/2000 |
| JP | 2005-295248 A | 10/2005 |

OTHER PUBLICATIONS

German Examination Report for the Application No. 10 2009 036 632.6-56 from German Patent and Trademark Office dated Apr. 30, 2010.

* cited by examiner

*Primary Examiner* — Hoai-An D Nguyen
(74) *Attorney, Agent, or Firm* — Cheng Law Group, PLLC

(57) ABSTRACT

A proximity sensor includes an L-C resonator, an oscillator for oscillating the L-C resonator, an oscillation detector, an output circuit, and a burnout detecting means. The L-C resonator has a detection coil for detecting an object, and a resonant capacitor connected across the detection coil. The oscillation detector detects an oscillation of the L-C resonator. The burnout detecting means has a time counter for counting a length of a positive voltage period in which a voltage across the resonant capacitor is kept above a predetermined positive voltage, and a discriminator which determines burnout of the detection coil when the counted length exceeds a half of an oscillation cycle of the L-C resonator. The output circuit outputs a detection signal indicative of whether or not the object exists within a detection range of the detection coil, and provides a burnout signal indicative of the burnout of the detection coil.

3 Claims, 3 Drawing Sheets

PROXIMITY SENSOR

TECHNICAL FIELD

The present invention is directed to a proximity sensor, more particularly to a high-frequency oscillatory proximity sensor.

BACKGROUND ART

JP2005-295248 A discloses a high-frequency oscillatory proximity sensor, which makes a contactless detection of a metal-made object (an electrical conductor) or an object of magnetic material. The proximity sensor includes a parallel L-C resonator composed of a capacitor and a detection coil which is caused to oscillate in the absence of the object within a detection range. Also included in the proximity sensor are an oscillator driving the resonator to oscillate and an oscillation detector which detects an amplitude of the oscillation and provides a corresponding output voltage for determination of whether or not the object is present based upon the level of the output voltage.

In view of that the detection coil may be broken or burnout for some reasons, it has been demanded to make an early detect ion of the burnout of the detection coil. Such scheme of detecting the burnout has been proposed, for example, in JP2000-132226 A.

The scheme requires the steps of converting the sensor output into a corresponding voltage, and comparing the voltage with a threshold for determination of the burnout.

A straightforward modification could be possible to apply the above scheme into the proximity sensor of JP2005-295248 such that the burnout detection can be determined by a comparison of the voltage of an output voltage from the oscillation detector with a predetermined threshold.

However, the above modification would suffer from a drawback in that the oscillation detector is difficult to discriminate the burnout of the coil from a detection of the object in a certain condition where the L-C resonator sees a slight oscillation, thereby failing to detect the burnout reliably and independently from the detection of the object. This occurs in the above mentioned proximity sensor in which a bias current flows from the oscillator into the ground such that the oscillation detector acknowledges a voltage caused by the flow of the bias current as if it comes from the oscillation of the L-C resonator, even when the detection coil is broken or burned out to stop the oscillation. The voltage thus generated as a consequence of the burnout of the detection coil cannot be distinguished from the voltage caused by the oscillation of the L-C resonator.

While the L-C resonator keeps oscillating with the unbroken detection coil, the voltage across the resonant capacitor constantly shows a sinusoidal waveform of several volts, or an AC voltage having an amplitude in proportion to the distance between the object and the detection coil while the L-C resonator keeps oscillating. This means that the oscillation detection signal obtained by rectification of the AC voltage is always generated while the L-C resonator keeps oscillating. In case the detection coil is broken, the bias current from the oscillator does not pass through the detection coil, but is caused to flow towards the ground by way of transistors and resistors included in the oscillator. Accordingly, even when the detection coil is broken, the output signal shows a certain voltage which is almost the same as the voltage generated when the L-C resonator keeps oscillating in a certain condition.

In other words, the proximity sensor sees only a slight voltage difference between when the oscillation becomes small and when the detection coil is broken. In view of that the proximity sensor functions inherently to vary the oscillation voltage in proportion to the distance between the object and the detection coil, it is difficult to definitely distinct two thresholds (i.e., individual reference, voltages) relied upon respectively for detection of the nearby object and determination of the burnout of the detection coil, thereby failing to realize practically available detection accuracy.

DISCLOSURE OF THE INVENTION

In view of the above insufficiency, the present invention has been accomplished to provide a proximity sensor which is capable of reliably detecting possible burnout of the detection coil.

The proximity sensor according to the present invention includes an L-C resonator having a detection coil for detecting an object and a resonant capacitor connected across the detection coil, an oscillator configured to oscillate the L-C resonator, an oscillation detector configured to detect an oscillation of the L-C resonator; and an output circuit configured to determine whether or not said object exists within a detection range of the detection coil on a basis of the detected oscillation, and output a detection signal indicative of the presence of the object within the detection range. The sensor further includes a burnout detecting means having a time counter and a discriminator. The time counter is configured to count a length of a positive voltage period in which a voltage across the resonant capacitor of the L-C resonator is kept above a predetermined positive voltage. The discriminator is configured to determine a burnout of the detection coil when the length of the positive voltage period exceeds a half of an oscillation cycle of the L-C resonator. The output circuit is configured to provide a burnout signal indicative of the burnout of the detection coil determined by the discriminator.

While the detection coil is free from the burnout, the resonant capacitor of the L-C resonator develops thereacross an AC voltage of which amplitude is proportional to a distance between the detection coil and the object. In this condition, the length of the positive voltage period becomes shorter than the half of the oscillation cycle of the L-C resonator, so that the discriminator determines that the detection coil is free from the burnout. When, on the other hand, the detection coil is broken, the resonant capacitor develops thereacross a positive DC voltage, thereby prolonging the length of the positive voltage period beyond the half of the oscillation cycle of the L-C resonator. Upon this occurrence, the discriminator determines that the detection coil is broken, and the output circuit outputs the burnout signal instead of the detection signal. Accordingly, the proximity sensor of the present invention is capable of reliably detecting the burnout of the detecting coil and providing information indicative of the event.

Preferably, the discriminator is composed of a judge capacitor and a judge circuit. The time counter is composed of a charger and a discharger. The charger is configured to charge the judge capacitor over the positive voltage period. The discharger is configured to discharge the judge capacitor during a negative period in which a voltage across the resonant capacitor is kept below the predetermined positive voltage. The determination circuit is configured to determine the burnout of the detection coil when the judge capacitor is charged up to a voltage exceeding a predetermined voltage.

Further, the proximity sensor is preferred to include a power controller which is configured to supply an electrical power to the output circuit, and to terminate supplying the electrical power when the discriminator determines the burnout of the detection coil. In this instance, the burnout is defined by a signal that the output circuit provides upon receiving no electric power from said power controller.

Upon detection of the burnout, the power controller responds to stop supplying the electric power to the output circuit for reducing a risk of accidental electric shock that a user would otherwise experience when the user touches some exposed circuit components. Moreover, by making the use of the termination of the electric power, it is possible to generate the burnout signal based on the power consumption of the proximity sensor.

DESCRIPTION OF THE PREFERRED EMBODIMENTS

1st Embodiment

Figure 1:
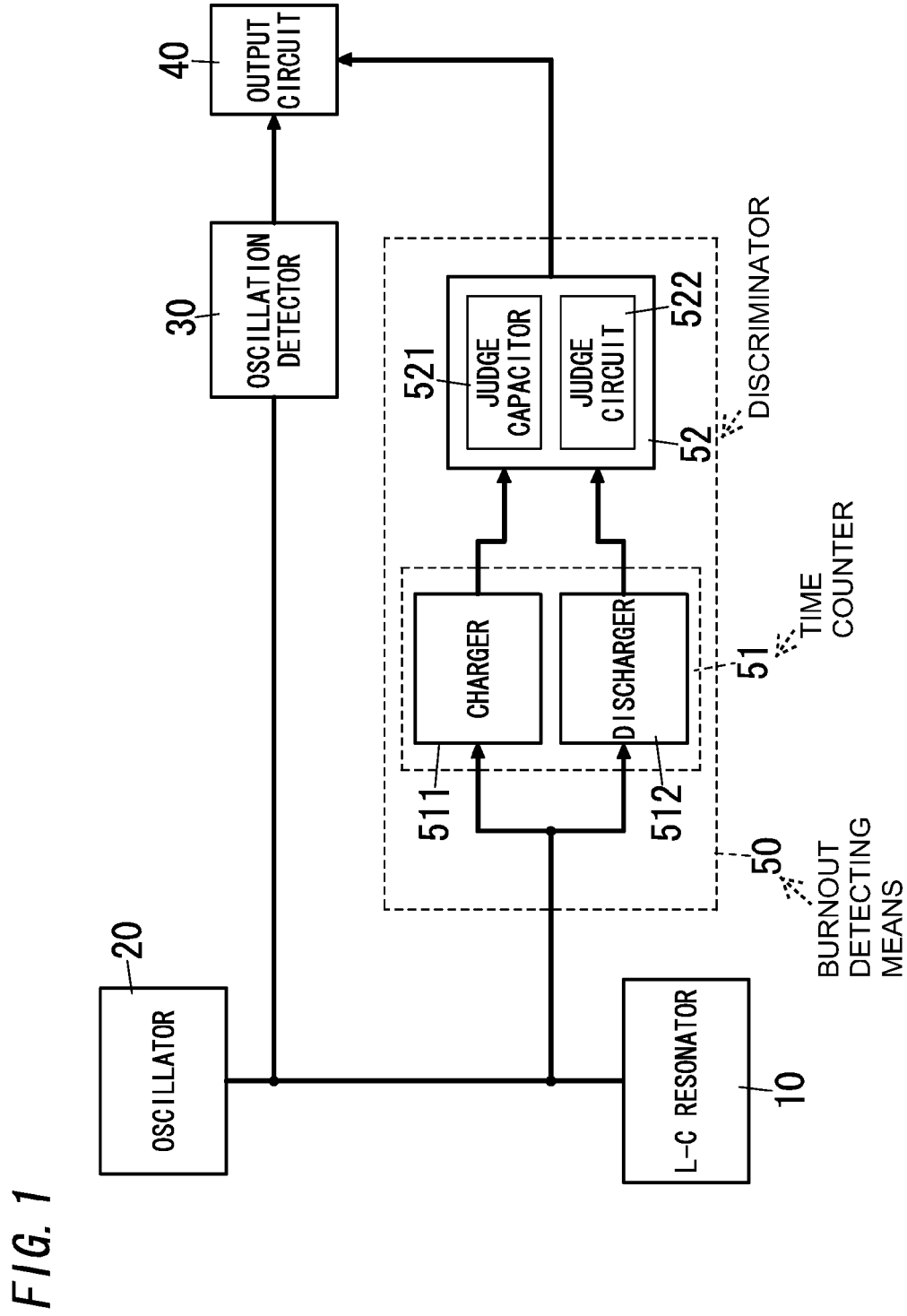
FIG. 1 is a block diagram illustrating a proximity sensor in accordance with a first embodiment of the present invention.
Figure 2:
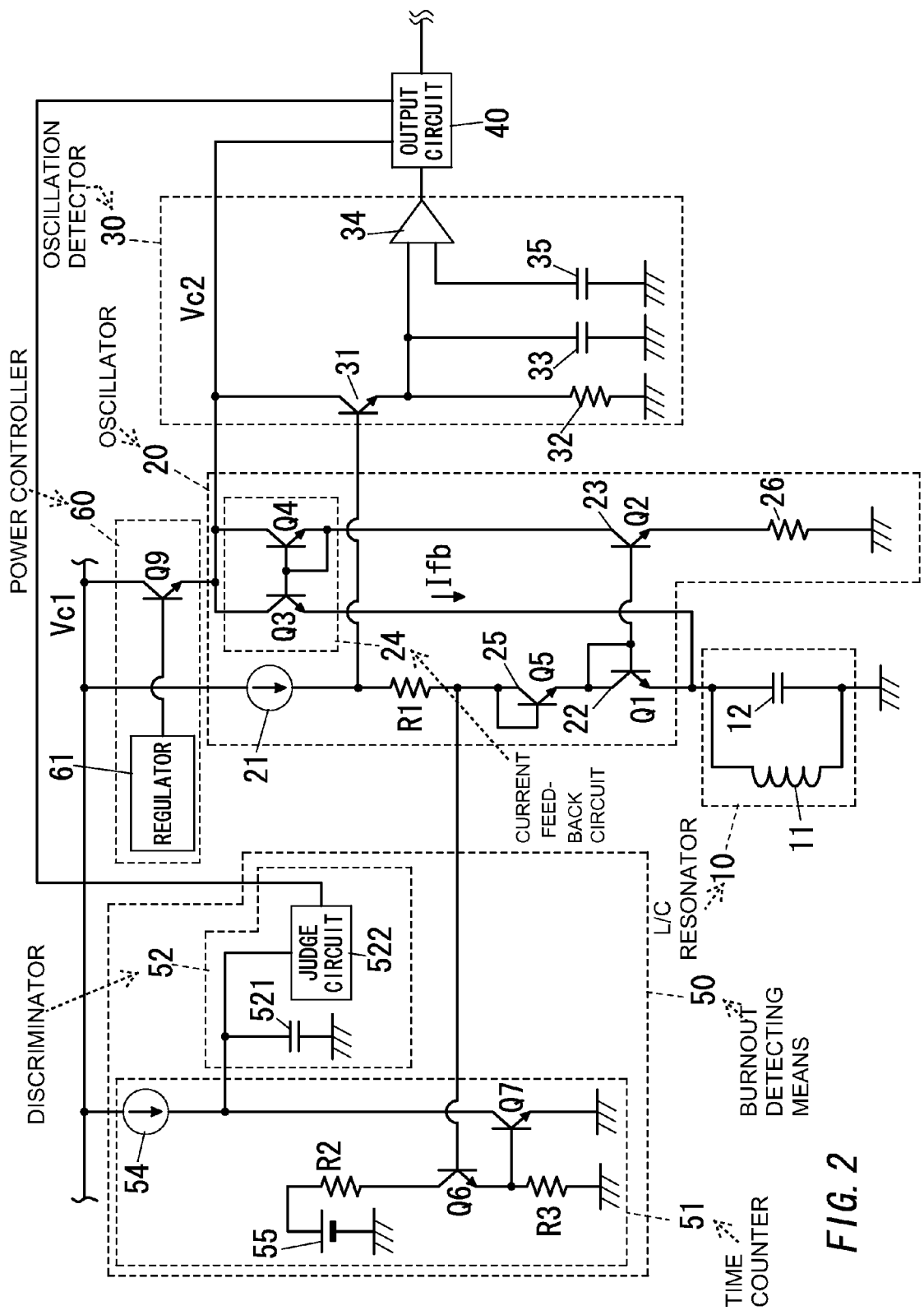
FIG. 2 is a circuit diagram illustrating the above proximity sensor.

Now referring to FIGS. 1 and 2, there is shown a proximity sensor in accordance with a first embodiment of the present invention. The proximity sensor includes an L-C resonator 10, an oscillator 20, an oscillation detector 30, an output circuit 40, a burnout detecting means 50, and a power controller 60.

The power controller 60, which is configured to supply an electric power to the oscillator 20, the oscillation detector 30, and the output circuit 40, includes a PNP transistor Q9 and a regulator 61. An emitter of transistor Q9 is connected to a first power line Vc1 leading from an internal power source (not shown) of the proximity sensor. A collector of transistor Q9 is connected to a second power line Vc2 which supplies the electric power to the oscillator 20, the oscillation detector 30, and the output circuit 40. The regulator 61 controls transistor Q9 to keep a voltage of the second power line Vc2 above a predetermined voltage. For example, when the voltage of the internal power source is 12V, the regulator 61 controls transistor Q9 so that the second power line Vc2 gives a voltage of 5V. The regulator 61 further has a stop terminal and is configured to terminate supplying the electric power when the stop terminal is electrically grounded.

The L-C resonator 10 is a resonator circuit which has a detection coil 11 for detecting an object (not shown) and a resonant capacitor 12 connected across the detection coil 11. An oscillation frequency of the L-C resonator 10 is determined by inductance of the detection coil 11 and electrostatic capacitance of the resonant capacitor 12. The detection coil 11 has a cylindrical coil bobbin and a conductive wire (with insulating sheath) wound around the coil bobbin. The object, for example, has a tubular shape, and is located close around the detection coil 11 to be movable in an axial direction of the coil bobbin.

The oscillator 20 has a bias circuit (a first bias circuit) 21 which is a constant current source providing a constant bias current to the L-C resonator 10 from the first power line Vc coupled to the internal power source. The oscillator 20 is arranged to supply a current to the L-C resonator 10 by means of positive feedback control in order to keep the L-C resonator 10 oscillating. The oscillator 20 has a level-shift circuit (a first level shift circuit) 22, an amplifier 23, and a current feedback circuit 24 for supplying a feedback current Ifb to the L-C resonator 10. The first level-shift circuit 22 shifts a magnitude of a voltage VT applied across the resonant capacitor 12 of the L-C resonator 10. The amplifier 23 outputs a current which is proportional to a voltage VT of the L-C resonator 10. The current feedback circuit 24 keeps the L-C resonator 10 oscillating while supplying to the L-C resonator 10 the feedback current Ifb corresponding to a current output from the amplifier 23.

The first level-shift circuit 22 has an NPN transistor Q1. A collector of transistor Q1 is electrically connected to an output of the first bias circuit 21. A first end of the L-C resonator 10 is electrically grounded, and a second end of the L-C resonator 10 is connected to an emitter of transistor Q1. That is, a parallel circuit composed of the detection coil 11 and the resonant capacitor 12 is inserted between the emitter of transistor Q1 and the ground. Consequently an electrical potential of the emitter of transistor Q1 becomes equal to an electrical potential of the second end of the L-C resonator 10 (a voltage of the emitter of transistor Q1 becomes equal to the voltage VT). The collector of transistor Q1 is connected to a base of transistor Q1.

The first level-shift circuit 22 shifts the voltage VT by an extent of a collector-emitter voltage of a NPN transistor Q2 in the amplifier 23 such that an emitter voltage of transistor Q2 (i.e., a voltage applied across the emitter of transistor Q2 and the ground) is made equal to the voltage VT of the L-C resonator 10 only for a positive half cycle of the oscillation of the L-C resonator 10.

The amplifier 23 is so-called an emitter follower circuit having the above transistor Q2. A base of transistor Q2 is connected to the base of transistor Q1. The electrical potential of the emitter of transistor Q1 (i.e., a level-shift voltage generated by the first level-shift circuit 22) is applied to the base of transistor Q2. Accordingly, the amplifier 23 outputs a current of a level corresponding to magnitude of the voltage VT of the L-C resonator 10.

The oscillator 20 further includes a resistor 26 for adjustment of an electrical potential of the emitter of transistor Q2. The resistor 26 is inserted between an output of the amplifier 23 (i.e., the emitter of transistor Q2) and the ground. Magnitude of a current output from the amplifier 23 depends on a resistance of the resistor 26. Namely, the resistor 26 can make an adjustment of the feedback current Ifb. A magnitude of the feedback current Ifb being fed into the L-C resonator 10 is determined by a resistance of the resistor 26.

The current feedback circuit 24 is a current mirror composed of a PNP transistor Q3 and Q4. Transistor Q3 is inserted between transistor Q2 of the amplifier 23 and the second power line Vc2 such that a collector of transistor Q3 is connected to the collector of transistor Q2 and an emitter of transistor Q3 is connected to the second power line Vc2. A base of transistor Q3 is connected to a base of transistor Q4. An emitter of transistor Q4 is connected to the second power line Vc2, and a collector of transistor Q4 is connected to the emitter of transistor Q1.

A collector current of transistor Q2, which is a current flowing through transistor Q3 between the emitter and the collector, is equal to a current output by the amplifier 23. A current flowing through transistor Q4 between the emitter and the collector is the same magnitude as the current flowing through transistor Q3 between the collector and the emitter. In short, the current feedback circuit 24 supplies the feedback current Ifb of which magnitude is equal to the current output by the amplifier 23.

The oscillator 20B additionally has level shift circuit (a second level-shift circuit) 25 for detection of the burnout of the detection coil 11.

The second level-shift circuit 25 is composed of an NPN transistor Q5, and is inserted between the first bias circuit 21 and the first level-shift circuit 22. A collector of transistor Q5 is connected to the output of the first bias circuit 21 through a resistor R1, with an emitter of transistor Q5 being connected to the collector of transistor Q1, and with a base of transistor Q5 being connected to the collector thereof. The base of transistor Q5 is connected to a base of an PNP transistor Q6 included in the burnout detecting means 50 so as to apply such a shifted voltage to the base of transistor Q6, the shifted voltage being a voltage which is the reference voltage VT added with a base-emitter voltage of transistor Q5. The second level-shift circuit 25 is provided to add the base-emitter voltage of transistor Q5 to the reference voltage VT such that the reference voltage is kept above zero while the L-C resonator 10 is oscillating. Besides, the first bias circuit 21 is coupled to the first power line Vc1 to receive a necessary power, while the emitter of each of transistors Q3 and Q4 is connected to receive its power from the second power line Vc2.

The oscillation detector 30 is configured to detect an oscillation, i.e., a peak value of the oscillation amplitude of the L-C resonator 10, and is composed of an NPN transistor 31, a resistor 32, and a capacitor 33. A collector of transistor 31 is connected to the second power line Vc2. A base of transistor 31 is connected to the collector of transistor Q1. An emitter of transistor 31 is coupled with the resister 32 as well as the capacitor 33. A current flowing through transistor 31 between the collector and the emitter in an amount depending on a voltage applied to the base of transistor 31, namely the voltage VT of the L-C resonator 10. That current flows into the capacitor 33 to charge the capacitor 33. The oscillation detector 30 outputs an oscillation signal having a voltage equal to a voltage developed across the capacitor 33. The oscillation signal indicates the oscillation (i.e., the oscillation amplitude) of the L-C resonator 10.

Further, the oscillation detector 30 includes a comparator 34 which determines the presence or absence of the object within the detection area.

An oscillation of the L-C resonator 10 necessitates a condition that an absolute value of a negative conductance of the oscillator 20 is not less than an absolute value of a conductance of the detection coil 11. The conductance of the detection coil 11 will vary due to an eddy-current loss proportional to a distance between the object and the detection coil 11. Namely, the conductance of the detection coil 11 reflects the distance between the object and the detection coil 11. Accordingly, when the L-C resonator 10 is configured to oscillate in a condition where the object is away from the detection range, the oscillation amplitude decreases as the object comes closer to the detection coil 11, because the absolute value of the conductance of the detection coil 11 becomes greater than the absolute value of the negative conductance of the oscillator 20 as the object comes closer to the detection coil 11.

Consequently, the comparator 34 determines that the object exists within the detection range when the oscillation amplitude is less than the reference value, and then outputs the detection signal having a predetermined voltage. On the other hand, the comparator 34 determines that the object is beyond the detection range when the oscillation amplitude is not less than the reference value, and outputs the detection signal having a higher voltage than the predetermined voltage. In this manner, the voltage of the detection signal shows whether or not the object exists within the detection range.

In this embodiment, the comparator 34 compares the voltage across capacitor 33 with a predetermined threshold for determining whether or not oscillation amplitude of the L-C resonator 10 is greater than the threshold. When the voltage across the capacitor 33 is greater than the threshold, the comparator 34 outputs a high-voltage object detection signal to the output circuit 40 indicative of that the object exists within the detection range. On the contrary, when a voltage across the capacitor 33 is not greater than the threshold, the comparator 34 outputs a low-voltage object detection signal to the output circuit 40, indicative of that the object does not exist within the detection range. The threshold is provided to the comparator 34 by the power source 35.

The burnout detecting means 50 is provided for detecting whether or not the detection coil 11 is broken, and is composed of a time counter 51 and a discriminator 52. The time counter 51 is configured to detect a length of time, i.e., a positive voltage period in which a voltage VT across the resonant capacitor 12 of the L-C resonator 10 is kept above a predetermined positive voltage Vp. The time counter 51 has a charger 511 which acts as a trigger circuit and a discharger 512 which acts as a trigger invalidation circuit.

The discriminator 52 is configured to determine the burnout of the detection coil 11 when the length of time (i.e., a positive voltage period) exceeds a half of an oscillation cycle of the L-C resonator 10. The discriminator 52 includes a judge capacitor 521 and a judge circuit 522 which compares a voltage Vin developed across the judge capacitor 521 with a predetermined threshold voltage Vth. When the voltage Vin exceeds the voltage Vth, the judge circuit 522 determines the burnout of the detection coil 11, and outputs a high-voltage burnout detection signal to the output circuit 40. When, on the other hand, the voltage Vin falls below the voltage Vth, the determination circuit 522 determines that the detection coil 11 is free from the burnout, and outputs a low-voltage burnout detection signal to the output circuit 40.

In response to the outputs from the oscillation detector 30 and the discriminator 52, the output circuit 40 analyzes to see whether the voltage of the object detection signal from the oscillation detector 30 is high or low, and to see whether the voltage of the burnout detection signal is high or low, and generates an output signal indicative of the presence of the object within the detection range as well as the burnout of the detection coil 11. For instance, when receiving the high-voltage object detection signal and the low-voltage burnout detection signal, the output circuit 40 generates a first output signal having a first voltage of e.g., 1±0.2 V, which indicates the presence of the object within the detection range. When receiving the low-voltage object detection signal and the low-voltage burnout detection signal, the output circuit 40 generates a second output signal having a second voltage of e.g. 5±0.2 V, which is higher than the first voltage and indicates that the absence of the object within the detection range. When receiving the high-voltage burnout detection signal, the output circuit 40 generates a third output signal having a third voltage of e.g. below 0.5, which is lower than the first voltage, and indicates the burnout of the detection coil. In this manner, the output circuit 40 generates the output signal of different voltage levels, which is processed by an associated circuit to provide information showing whether or not the object is present within the detection range and whether or not the detection coil is broken.

The charger 511 is configured to start to charge the judge capacitor 521 when the reference voltage VT exceeds the predetermined positive voltage Vp, and to terminate charging the judge capacitor 521 when the reference voltage VT falls below the predetermined positive voltage Vp.

The discharger 512 is configured to start to discharge the judge capacitor 521 when the reference voltage VT falls below the predetermined positive voltage Vp, and to terminate discharging the judge capacitor 521 when the reference voltage VT exceeds the predetermined positive voltage Vp. Thus, the discharger 512 discards an electric charge accumulated in the judge capacitor 521 in each of alternating the positive voltage periods. The predetermined positive voltage Vp is set to be greater than zero and not greater than the reference voltage VT expected to develop in response to the burnout of the detection coil.

As mentioned above, the charger 511 functions to increase the input voltage Vin during the positive voltage period in which the reference voltage VT is not less than the predetermined voltage Vp, while the discharger 512 functions to decrease the input voltage Vin during the negative period in which the reference voltage VT is less than the predetermined voltage Vp.

In this manner, the judge capacitor 521 is charged during the positive voltage period to increase the input voltage Vin, and is discharged during the negative voltage period to decrease the input voltage Vin. In the present embodiment, the judge capacitor 521 is charged and discharged at the same rate.

FIG. 2 shows the burnout detecting means 50 has the time counter 51 including transistor Q6, an NPN transistor Q7, and resistors R2 and R3. In addition, the burnout detecting means 50 has the discriminator 52, a bias circuit (a second bias circuit) 54, and a reference power source 55. The second bias circuit 54 acts as a constant current source which supplies a constant bias from the first power line Vc1. The reference power source 55 generates the predetermined positive voltage Vp. An emitter of transistor Q6 is connected to the reference power source 55 through resistor R2. A voltage of the reference power source 55 and a resistance of the resistor R2 are selected such that transistor Q6 receives at its emitter a voltage which is a sum of the predetermined voltage Vp and the base-emitter voltage of transistor Q5.

Transistor Q6 is turned on when its base sees a voltage lower than its emitter, and is otherwise turned off. The voltage applied to the emitter of transistor Q6 is equal to the sum of the predetermined voltage Vp and the base-emitter voltage of transistor Q5. The voltage applied to the base of transistor Q6 is equal to the sum of the reference voltage VT and the base-emitter voltage of the transistor Q5. Consequently, transistor Q6 is turned off when the positive voltage period in which the reference voltage VT is kept above the predetermined voltage Vp, and turned on when the negative voltage period in which the reference voltage Vt is kept below the predetermined voltage Vp. A collector of transistor Q6 is connected to the ground through resistor R3 and to a base of transistor Q7. Therefore, transistor Q7 is turned on when transistor Q6 is turned on, and turned off when transistor Q6 is turned off. A collector of transistor Q7 is connected to an output of the second bias circuit 54, and an emitter of transistor Q7 is grounded.

During the positive voltage period, the judge capacitor 521 is not shunted by transistor Q7 because both of transistors Q6 and Q7 are turned off. In this condition, a bias current from the second bias circuit 54 is allowed to flow into the judge capacitor 521 for charging the same with a resulting increase of the input voltage Vin. During the negative voltage period, the judge capacitor 521 is shunted by transistor Q7 as a result of that both of transistors Q6 and Q7 are turned on, whereby the judge capacitor 521 is discharged with a resultant decrease of the input voltage Vin. In this manner, the circuit 51 including transistors Q6 and Q7, resistors R2 and R3, the second bias circuit 54 and the reference power source 55 acts as the charger 511 as well as the discharger 512.

While the detection coil 11 is free from the burnout, the reference voltage VT takes a form of an AC voltage having amplitude proportional to the distance between the object and the detection coil 11 when the detection coil 11 is free from the burnout. As a result, the length of the positive voltage period becomes shorter than the half of the oscillation cycle of the L-C resonator 10, and shorter than that of the negative voltage period thereof. Thus, the judge capacitor 521 repeats charging and discharging. When, on the other hand, the detection coil 11 sees the burnout, the L-C resonator does not oscillate so that the charger 511 keeps charging the judge capacitor 521 for accumulating a considerable DC voltage thereat.

In consideration of the above effect, the threshold voltage Vth is determined such that the input voltage Vin becomes greater than the threshold voltage Vth in response to a condition where the length of the positive voltage period exceeds the half of the oscillation cycle of the L-C resonator 10. Therefore, while the detection coil 11 is free from the burnout, the judge capacitor 521 repeats charging and discharging to keep the input voltage Vin below the threshold voltage Vth. Upon occurrence of the burnout, the judge capacitor 521 is caused to keep charging to an extent that the input voltage Vin exceeds the threshold voltage Vth.

In this manner, the burnout detecting means 50 determines the burnout of the detection coil 11 when the input voltage Vin exceeds the threshold voltage Vth, i.e., the length of the positive voltage period exceeds the half of the oscillation cycle of the L-C resonator 10.

As mentioned above, while the detection coil 11 is free from the burnout, the reference voltage VT across the resonant capacitor 12 of the L-C resonator 10 gives an AC voltage of which amplitude is proportional to the distance between the detection coil 11 and the object. Under this condition, the length of the positive voltage period is kept shorter than that of the negative voltage period and at the same time shorter than half of the oscillation cycle of the L-C resonator 10 so that the input voltage Vin is kept below the threshold voltage Vth. Therefore, the output circuit 40 can provide the output indicative of that the detection coil 11 is free from the burnout. Once the detection coil 11 is broken, the reference voltage VT becomes a positive DC voltage, and the input voltage Vin exceeds the threshold voltage Vth as a result of that the length of the positive voltage period becomes longer than the half of the oscillation cycle of the L-C resonator 10. Therefore, the output circuit 40 provides the burnout detection signal indicative of the burnout of the detection coil 11, rather than the object detection signal. The burnout detection signal is processed at the associated circuit, for example, a vehicle's electronic control unit (ECU) for enabling a fail-safe scheme in consideration of the burnout of the detection coil 11.

In the present embodiment, the charger 511 acts as a trigger circuit of varying the input voltage Vin from an initial value according to the length of the positive period, and the discharger 512 acts as a trigger invalidation circuit of resetting the input voltage to the initial value. However, it is equally possible to use the charger 511 as the trigger invalidation circuit and the discharger 512 as the trigger circuit. In this instance, the discharger 512 is configured to decrease the input voltage Vin by discharging the judge capacitor 521 during the positive voltage period, while the charger 511 is configured to increase the input voltage Vin by charging the judge capacitor 521 for the negative voltage period. In addition, the threshold voltage Vth is determined such that the input voltage Vin becomes lower than the threshold voltage Vth when the length of the positive voltage period exceeds the half of the oscillation cycle of the L-C resonator 10. With this arrangement, the judge capacitor 521 repeats charging and discharging such that the input voltage Vin is kept above the threshold voltage Vth while the detection coil 11 is free from the burnout. In this connection, the judge capacitor 521 is kept discharging such that the input voltage Vin falls below the threshold voltage Vth, and the discriminator 52 is configured to determine the burnout of the detection coil 11 when the input voltage Vin is less than the threshold voltage Vth.

It is noted that the oscillation detector 30 may be configured to detect an integration value or an effective value of the oscillation voltage of the L-C resonator 10 as an alternative to the peak value of the oscillation amplitude. Further, the oscillation detector 30 may be configured to detect an oscillation frequency or other oscillation parameters instead of the oscillation amplitude (i.e., the amplitude of the oscillation voltage).

Although the proximity sensor of the present embodiment is configured to terminate the oscillation of the L-C resonator 10 when the object comes close to the detection coil 11, it may be configured to start oscillating the L-C resonator 10 when the object comes close to the detection coil 11.

It is noted that a conductance of the detection coil 11 varies depending on an oscillation frequency of the L-C resonator 10 as well as the distance between the object and the detection coil 11. Thus, as the resonant capacitor 12 varies its capacitance, the detection coil 11 will also varies its conductance. Consequently, the proximity sensor of the present embodiment as well as of the second embodiment hereinafter described is also available as a capacitance sensor.

2nd Embodiment

Figure 3:
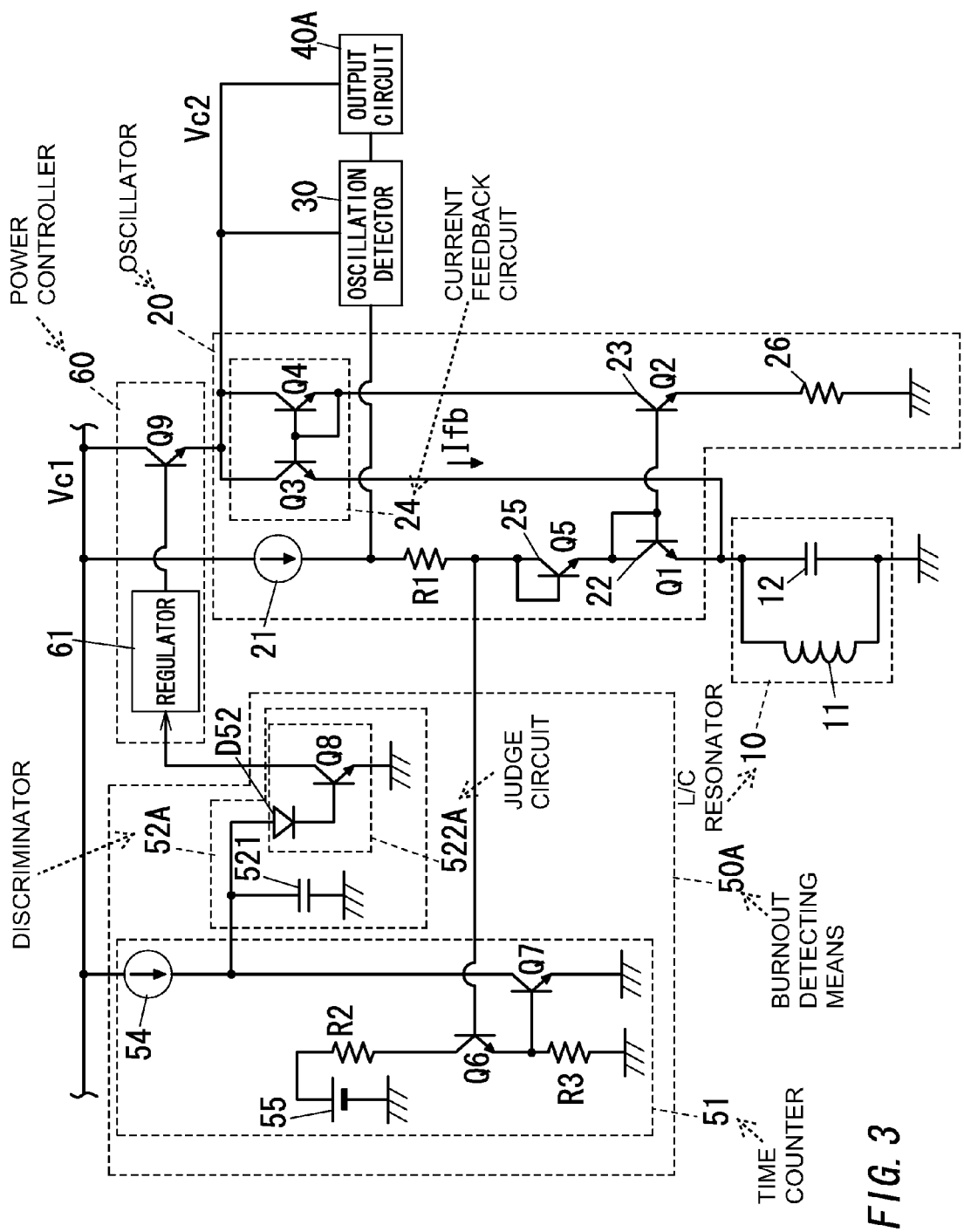
FIG. 3 is a circuit diagram illustrating a proximity sensor in accordance with a second embodiment of the present invention.

Now referring to FIG. 3, an explanation is made to a proximity sensor according to the second embodiment of the present invention which is basically identical to the first embodiment except for inclusion of an associated modification of the output circuit 40A and the burnout detecting means 50A. Like parts are designated by like reference numerals optionally with a suffix letter of "A", and no duplication explanation is deemed necessary.

The discriminator 52A in the burnout detecting means 50A includes the judge capacitor 521, a diode D52, and an NPN transistor Q8. The diode D52 is cooperative with transistor Q8 to define the above-mentioned judge circuit 522. The judge capacitor 521 is inserted between the second bias circuit 54 and the ground. The diode D52 has its anode connected to a high-side of the judge capacitor 521, and has its cathode connected to a base of transistor Q8. Transistor Q8 has its collector connected to the stop terminal of the regulator 61, and has its emitter connected the ground. The discriminator 52A, composed of the judge capacitor 521, transistor Q8, and diode D52, are arranged such that transistor Q8 is turned on when the input voltage Vin exceeds the predetermined threshold voltage Vth. The threshold voltage Vth is selected such that the input voltage Vin becomes greater than the threshold voltage Vth when the length of the positive voltage period exceeds the half of the oscillation cycle of the L-C resonator 10.

As mentioned above, the judge capacitor 521 repeats charging and discharging such that the input voltage Vin is kept below the threshold voltage Vth while the detection coil 11 is free from the burnout. In contrast, when the detection coil 11 sees the burnout, the judge capacitor 521 is kept charging to such an extent that the input voltage Vin exceeds the threshold voltage Vth.

Consequently, transistor Q8 is turned on only upon detection of burnout of the detection coil 11. When transistor Q8 is turned on, the regulator 61 is grounded at its ground terminal to turn off transistor Q9, thereby terminating the supply of the electric power to the current feed back circuit 24 from the first power line Vc1, and therefore stopping the supply of the feedback current Ifb. Also in this condition, the oscillation detector 30 and the output circuit 40A are deactivated.

The output circuit 40A provides an output which is determined based on the object detection signal from the oscillation detector 30 and indicative of whether or not the object exists within the detection range. When the high-voltage object detection signal is received, the output circuit 40A provides the first output signal of a first voltage, e.g. 1±0.2 V indicative of that the object is present within the detection range. When receiving the low-voltage object detection signal, the output circuit 40A provides the second output signal of a second voltage, e.g. 5±0.2 V which is higher than the first voltage and indicative of that the object is not present within the detection range.

When the power controller 60 terminates supplying the electric power to the output circuit 40A, the output circuit 40A is deactivated to provide a third voltage, which is a null voltage and is acknowledged as the burnout detection signal indicative of the burnout of the detection coil.

Thus, the output circuit 40A provides the output of varying voltage in accordance with the detection result for indication of whether or not the object is present within the detection range and also whether or not the detection coil 11 is broken.

It is likely that the burnout of the detection coil 11 occurs mainly as a consequence of a fatal trouble in the proximity sensor, for example, a trouble in a movable mechanism of the detection coil, and that an electrical circuitry of the proximity sensor is exposed to be easily accessible from the outside.

With the provision of the power controller 60 that supplies the electric power to the output circuit 40A, the proximity sensor of the present embodiment is enabled to terminate the supply of the electric power upon seeing the burnout of the detection coil, thereby avoiding accidentally electrical shock which would otherwise occur when the user touches the exposed electrical circuit as a consequence of the failure.

Accordingly, the proximity sensor of the present embodiment has an additional advantage of reducing the risk of the electrical shock, and reducing power consumption once the detection coil 11 is determined to be broken. By making the use of such interruption of the power supply, the associated circuit, e.g. the vehicle's electronic control unit (ECU) can acknowledge the burnout of the detection sensor, i.e., the failure of the proximity sensor by monitoring the power consumption thereof.

The invention claimed is:

1. A proximity sensor comprising:
   an L-C resonator having a detection coil for detecting an object, and a resonant capacitor connected across said detection coil;
   an oscillator being configured to oscillate said L-C resonator;
   an oscillation detector being configured to detect an oscillation of said L-C resonator; and
   an output circuit being configured to determine whether or not said object exists within a detection range of said detection coil on a basis of said oscillation detected by said oscillation detector, and output a resultant detection signal indicative of the presence of said object within said detection range,
   said proximity sensor further comprising a burnout detecting means having a time counter and a discriminator, said time counter being configured to obtain a length of a positive voltage period in which a voltage appearing across said resonant capacitor is kept above a predetermined positive voltage, said discriminator being configured to determine a burnout of said detection coil when a length of said positive voltage period detected by said time counter exceeds a half of an oscillation cycle of said L-C resonator, said output circuit being configured to provide a burnout signal indicative of the burnout of the detection coil determined by said discriminator.

2. The proximity sensor according to claim 1 wherein, said discriminator including a judge capacitor and a judge circuit, said time counter comprising a charger and a discharger, said charger being configured to charge said judge capacitor within said positive voltage period, said discharger being configured to discharge said judge capacitor during a negative period in which the voltage across said resonant capacitor is kept below said predetermined positive voltage, said judge circuit being configured to determine said burnout of said detection coil when said judge capacitor is charged up to a voltage exceeding a predetermined voltage.

3. The proximity sensor according to claim 1 further comprising:

a power controller being configured to supply an electric power to said output circuit in order to activate said output circuit, and to terminate supplying the electric power when said discriminator determines said burnout of said detection coil, wherein said burnout signal is defined by a signal that said output circuit provides when receiving no electric power from said power controller.

* * * * *